(12) United States Patent
Chung et al.

(10) Patent No.: US 11,475,936 B2
(45) Date of Patent: Oct. 18, 2022

(54) MEMORY AND MEMORY SYSTEM (71) Applicant: SK hynix Inc., Gyeonggi-do (KR)

(72) Inventors: Hoiju Chung, San Jose, CA (US); Paul Fahey, Campbell, CA (US)

(73) Assignee: SK hynix Inc., Gyeonggi-do (KR)

( * ) Notice: Subject to any disclaimer, the term of this patent is extended or adjusted under 35 U.S.C. 154(b) by 60 days.

(21) Appl. No.: 16/939,696

(22) Filed: Jul. 27, 2020

(65) Prior Publication Data

US 2021/0174866 A1 Jun. 10, 2021

Related U.S. Application Data (60) Provisional application No. 62/944,577, filed on Dec. 6, 2019.

(51) Int. Cl.
*G11C 11/406* (2006.01)
*G11C 5/06* (2006.01)
*G11C 11/4076* (2006.01)
*G11C 11/408* (2006.01)

(52) U.S. Cl.
CPC .......... *G11C 11/40622* (2013.01); *G11C 5/06* (2013.01); *G11C 11/4076* (2013.01); *G11C 11/4085* (2013.01); *G11C 11/40615* (2013.01)

(58) Field of Classification Search
CPC ................................................ G11C 11/40622
USPC .......................................................... 365/222
See application file for complete search history.

(56) References Cited

U.S. PATENT DOCUMENTS

| | | | |
|---|---|---|---|
| 10,304,516 B1 * | 5/2019 | Hsu .................... | G11C 11/40626 |
| 2014/0380092 A1 * | 12/2014 | Kim .................... | G06F 11/1096 |
| | | | 714/6.24 |
| 2016/0077579 A1 * | 3/2016 | Gulati .................. | G06F 1/206 |
| | | | 713/323 |
| 2016/0086650 A1 * | 3/2016 | Kim .................... | G11C 11/406 |
| | | | 365/222 |
| 2017/0110177 A1 * | 4/2017 | Lee ...................... | G06F 3/0683 |
| 2017/0140810 A1 * | 5/2017 | Choi .................... | G11C 11/40607 |
| 2018/0150233 A1 * | 5/2018 | Hanzawa ............... | G11C 29/52 |

* cited by examiner

*Primary Examiner* — Muna A Techane
(74) *Attorney, Agent, or Firm* — IP & T Group LLP

(57) ABSTRACT

A memory includes a plurality of rows, each of which is coupled to a plurality of memory cells; a target row determining circuit suitable for determining a row that is likely to lose data among the plurality of rows as a target row; and a transfer circuit suitable for transferring, when a number of target rows determined by the target row determining circuit is equal to or greater than a threshold value, information representing that the number of target rows reaches the threshold value to a memory controller.

17 Claims, 5 Drawing Sheets

MEMORY AND MEMORY SYSTEM

CROSS-REFERENCE TO RELATED APPLICATIONS

This application claims the benefit of U.S. Provisional Application No. 62/944,577, filed on Dec. 6, 2019, the entire contents of which are incorporated herein by reference.

BACKGROUND

1. Field

Various embodiments of the present invention relate to a memory and a memory system.

2. Description of the Related Art

As the degree of integration of memories increases, the gap between a plurality of word lines included in a memory decreases. As the gap between the word lines decreases, the coupling effect between the neighboring word lines increases.

Whenever data is inputted to or outputted from a memory cell, a word line toggles between an inactive state and an active state. The increased coupling effect between the neighboring word lines may cause damage to data of the memory cells coupled to a word line which is adjacent to a frequently activated word line. This phenomenon is called row hammering or word line disturbance, which is a problem because data of a memory cell is damaged before the memory cell is refreshed.

Figure 1:
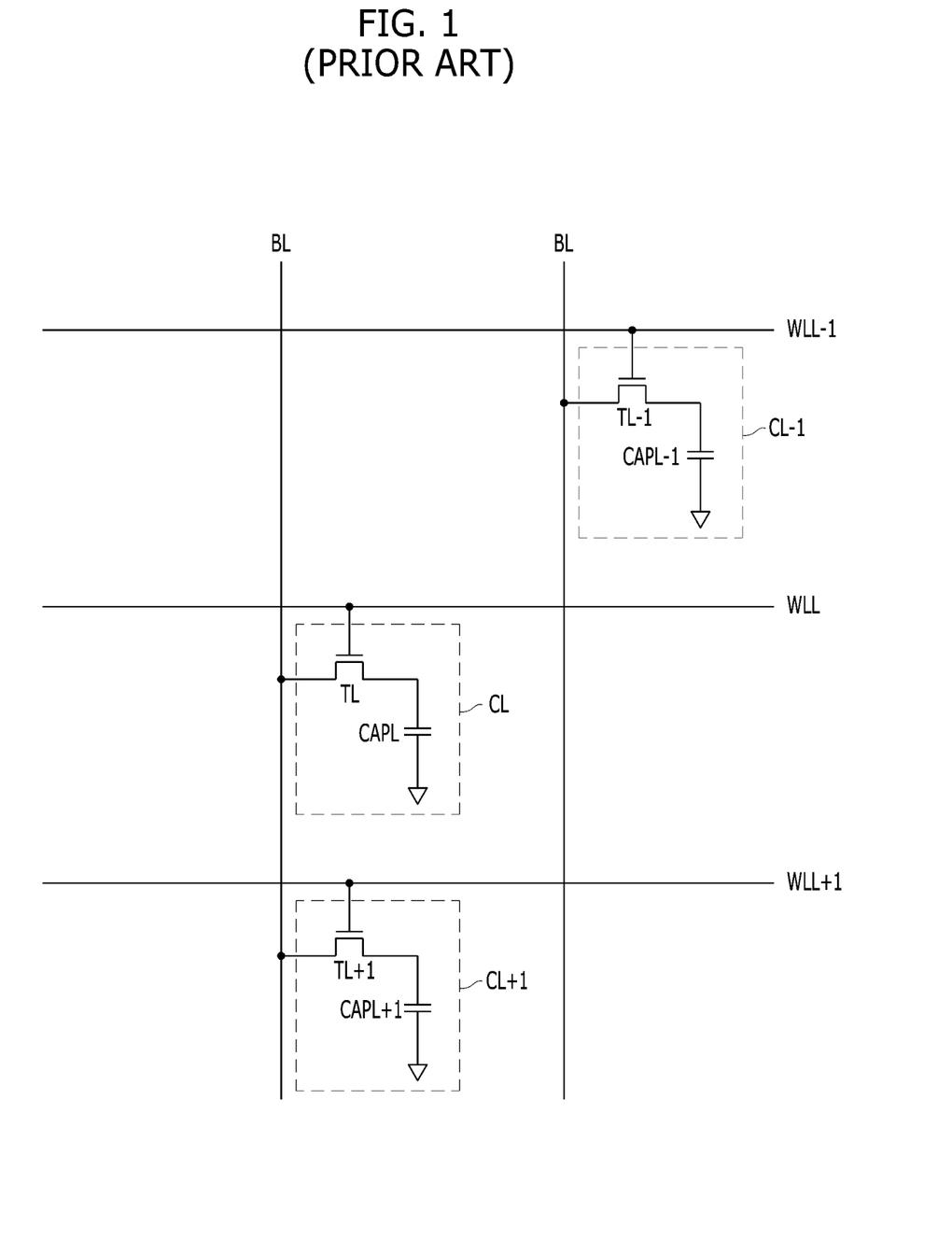
FIG. 1 is a schematic view illustrating a row hammering phenomenon and showing a part of a cell array included in a memory device.

FIG. 1 is a schematic view illustrating the row hammering phenomenon. FIG. 1 shows a part of a cell array included in a memory device.

In FIG. 1, 'WLL' may denote a word line with excessive activation times, which may be referred to as a frequently activated word line, and 'WLL−1' and 'WLL+1' may denote word lines disposed adjacent to the frequently activated word line WLL, which may be referred to as neighboring word lines. 'CL' may denote a memory cell coupled to the frequently activated word line WLL, and 'CL−1' may denote a memory cell coupled to the neighboring word line WLL−1, and 'CL+1' may denote a memory cell coupled to the neighboring word line WLL+1. The memory cells CL, CL−1, and CL+1 may include cell transistors TL, TL−1, and TL+1 and cell capacitors CAPL, CAPL−1, and CAPL+1, respectively.

In FIG. 1, when the frequently activated word line WLL is activated or deactivated, the voltages of neighboring word lines WLL−1 and WLL+1 may increase or decrease due to the coupling effect between the adjacent word lines WLL, WLL−1 and WLL+1, affecting the amount of charges of the cell capacitors CL−1 and CL+1.

Therefore, when the frequently activated word line WLL toggles between an inactive state and an active state, the amount of charges stored in the cell capacitors CAPL−1 and CAPL+1 included in the memory cells CL−1 and CL+1 may be changed and the data of the memory cells may be deteriorated.

Also, the electromagnetic wave generated as a word line toggles between the inactive state and the active state may damage data by charging or discharging electrons into or out of a cell capacitor of the memory cell coupled to a neighboring word line.

A method for improving the row hammering phenomenon may include detecting a row (i.e., a word line) that is activated excessive times and additionally refreshing the rows disposed adjacent to the row that is activated excessive times. Such an additional refresh operation may be generally performed hidden when a typical refresh operation is performed. For example, whenever a refresh command is applied to a memory N times, where N is an integer equal to or greater than 1, the memory may perform an additional refresh operation hidden without the memory controller knowing, in addition to a typical refresh operation.

Recently, a study on a cryogenic memory which operates at a cryogenic temperature has been conducted. At a cryogenic temperature, charges are scarcely discharged from the cell capacitor of a memory, so a refresh operation may be rarely performed or may not be performed at all. That is, since the data retention time of the memory cell is greatly increased at the cryogenic temperature, a refresh command may be rarely applied to the memory, compared to ordinary memories. However, even in a cryogenic memory, data loss due to the row hammering may occur. Therefore, the refresh command being rarely applied to the memory may inevitably decrease the number of the additional refresh operations performed in the memory, which is problematic.

SUMMARY

Embodiments of the present invention are directed to a technology for refreshing rows that need to be refreshed due to a row hammering phenomenon.

In accordance with an embodiment of the present invention, a memory includes: a plurality of rows, each of which is coupled to a plurality of memory cells; a target row determining circuit suitable for determining a row that is likely to lose data among the plurality of rows as a target row; and a transfer circuit suitable for transferring, when a number of target rows determined by the target row determining circuit is equal to or greater than a threshold value, information representing that the number of target rows reaches the threshold value to a memory controller.

In accordance with another embodiment of the present invention, a memory system includes: a memory controller; and a memory, wherein the memory includes: a plurality of rows, each of which is coupled to a plurality of memory cells; a target row determining circuit suitable for determining a row that is likely to lose data among the plurality of rows as a target row; and a transfer circuit suitable for transferring, when a number of target rows determined by the target row determining circuit is equal to or greater than a threshold value, information representing that the number of target rows reaches the threshold value to a memory controller, wherein the memory controller is suitable for transferring a command for refreshing the target rows to the memory when the information is received from the memory.

In accordance with yet another embodiment of the present invention, a memory system includes: a memory controller; and a memory, wherein the memory includes: a plurality of rows, each of which is coupled to a plurality of memory cells; a target row determining circuit suitable for determining a row that is likely to lose data among the plurality of rows as a target row; and a transfer circuit suitable for transferring, when a number of target rows determined by the target row determining circuit is equal to or greater than a threshold value, information representing that the number of target rows reaches the threshold value to a memory controller, wherein the memory controller is suitable for applying no command to the memory in a predetermined period after the information is received from the memory.

In accordance with still another embodiment of the present invention, a method for operating a memory system including a memory controller and a memory includes: determining, by the memory, a row that is likely to lose data among a plurality of rows as a target row; determining, by the memory, whether a number of target rows reaches a threshold value or not; and transferring, by the memory, information representing that the number of the target rows reaches the threshold value to the memory controller.

In accordance with still another embodiment of the present invention, a method for operating a memory system including a memory controller and a memory includes: determining, as a target row, a neighboring row disposed adjacent to a row with excessive activation times; checking whether a number of target rows reaches a threshold value or not; informing a memory controller when the number of the target rows reaches the threshold value; and performing a refresh operation on the target rows.

DETAILED DESCRIPTION

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise.

The articles 'a' and 'an' as used in this application and the appended claims should generally be construed to mean 'one or more' unless specified otherwise or it is clear from the context to be directed to a singular form.

Figure 2:
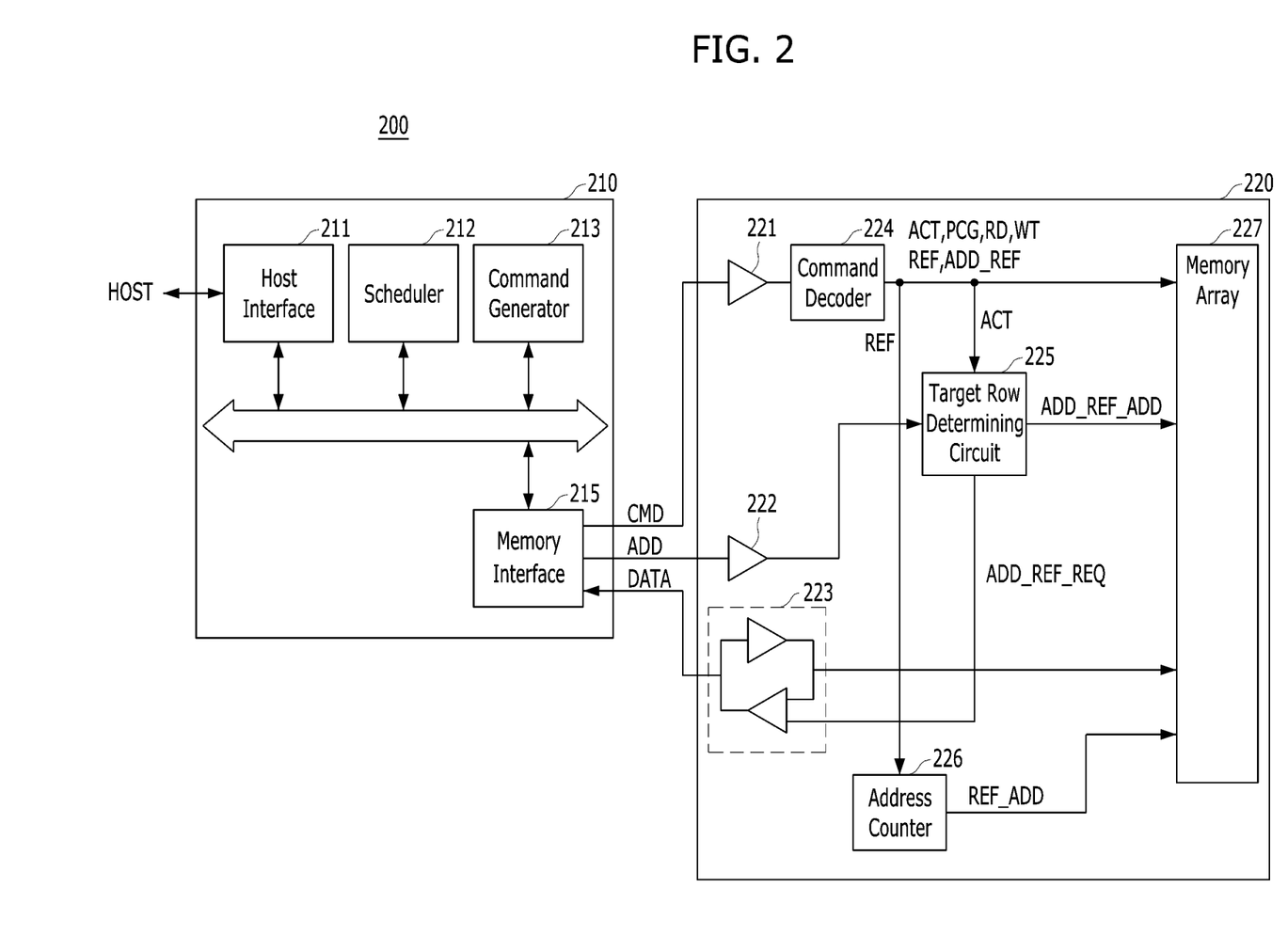
FIG. 2 is a block diagram illustrating a memory system 200 in accordance with an embodiment of the present invention.

FIG. 2 is a block diagram illustrating a memory system 200 in accordance with an embodiment of the present invention.

Referring to FIG. 2, the memory system 200 may include a memory controller 210 and a memory 220.

The memory controller 210 may control the operation of the memory 220 based on a request of a host HOST. The host HOST may include a central processing unit (CPU), a graphics processing unit (GPU), an application processor (AP), and the like. The memory controller 210 may include a host interface 211, a scheduler 212, a command generator 213, and a memory interface 215. The memory controller 210 may be included in a CPU, GPU, AP, or the like. In this case, the host HOST may refer to a structure other than the memory controller 210 in this configuration. For example, when the memory controller 210 is included in a CPU, the host HOST shown in the drawing may represent constituent elements except the memory controller 210 in the CPU.

The host interface 211 may be an interface for communication between the host HOST and the memory controller 210.

The scheduler 212 may determine the order of the requests to be directed to the memory 220 among the requests from the host HOST. In order to improve the performance of the memory 220, the scheduler 212 may change the order that the requests are received from the host HOST and the order of the operations to be directed to the memory 220. For example, although the host HOST requests for a read operation of the memory 220 first and then requests for a write operation subsequently, the scheduler 212 may be able to change the order of the requested operations such that the write operation is performed before the read operation.

The scheduler 212 may schedule a refresh operation between the operations requested from the host HOST to prevent the data of the memory 220 from being lost. When the memory system 200 operates in a cryogenic environment, the data retention time of the memory 220 may increases drastically. Therefore, in the cryogenic environment, the scheduler 212 may be able to schedule the refresh operation very rarely. For example, the scheduler 212 may schedule the refresh operation in such a manner that the memory cells of the memory 220 may be refreshed only once a day. Meanwhile, when information representing the number of rows classified as target rows reaches a threshold value is transferred from the memory 220, that is, when information representing that the number of rows that are likely to lose their data due to the row hammering phenomenon is equal to or greater than the threshold value is transferred from the memory 220, the scheduler 212 may schedule an additional refresh operation to prevent the data from being lost.

The command generator 213 may generate a command to be applied to the memory 220 according to the order of the operations that are determined by the scheduler 212.

The memory interface 215 may be an interface between the memory controller 210 and the memory device 220. A command CMD and an address ADD may be transferred from the memory controller 210 to the memory 220 through the memory interface 215, and data DATA may be transferred/received. The memory interface 215 may also be referred to as a PHY interface.

The memory 220 may perform an operation directed by the memory controller 210. The memory 220 may include a command receiving circuit 221, an address receiving circuit 222, a data transferring/receiving circuit 223, a command decoder 224, a target row determining circuit 225, an address counter 226, and a memory array 227.

The command receiving circuit 221 may receive a command CMD transferred from the memory interface 215 of the memory controller 210, and the address receiving circuit 222 may receive an address ADD transferred from the memory interface 215 of the memory controller 210. The data transferring/receiving circuit 223 may receive data DATA transferred from the memory interface 215 during a write operation and transfer data DATA to the memory interface 215 during a read operation. The memory 220 may be provided with a plurality of command pads (not shown), a plurality of address pads (not shown), and a plurality of data pads (not shown). The command receiving circuit 221 may receive a command CMD through the command pads, and the address receiving circuit 222 may receive an address ADD through the address pads, and the data transferring/receiving circuit may transfer/receive data DATA through the data pads.

The command decoder 224 may decode the command CMD received through the command receiving circuit 221 to generate internal command signals. The internal command signals may include an active signal ACT, a precharge signal PCG, a read signal RD, a write signal WT, a refresh signal REF, and an additional refresh signal ADD_REF.

The target row determining circuit 225 may determine a row (i.e., a word line) that is likely to lose data among a plurality of rows of the memory array 227 as a target row. The target row determining circuit 225 may select a row disposed adjacent to a row that is activated excessive times as a target row based on the active signal ACT and the address ADD which is received through the address receiving circuit 222. For example, when a fourth row is activated (i.e., accessed) excessive times, third and fifth rows that are adjacent to the fourth row may be selected as target rows. An additional refresh address ADD_REF_ADD outputted from the target row determining circuit 215 may be an address representing a target row. When the number of target rows is equal to or greater than a threshold value (e.g., 2), the target row determining circuit 215 may transfer information ADD_REF_REQ representing that the number of target rows reaches the threshold value, which is simply referred to as additional refresh operation requesting information, to the memory controller 210 through the data transferring/receiving circuit 223.

The address counter 226 may change the refresh address REF_ADD whenever the refresh signal REF is activated. The refresh address REF_ADD generated in the address counter 226 may be used not for an additional refresh operation but for a normal refresh operation.

The memory array 227 may perform the operations directed by the internal command signals ACT, PCG, RD, WT, REF, and ADD_REF. In an additional refresh operation in which the additional refresh signal ADD_REF is activated, the memory array 227 may perform a refresh operation on the row selected by the target address (i.e., an additional refresh address) ADD_REF_ADD outputted from the target row determining circuit 215. Also, in a refresh operation in which the refresh signal REF is activated, the memory array 227 may perform a refresh operation on the row selected by the refresh address REF_ADD. Also, the address ADD transferred from the memory controller 210 may be used during the active, read, and write operations of the memory array 227. The memory array 227 may include constituent elements for the operations such as an active operation, a precharge operation, a read operation, a write operation, a refresh operation, and an additional refresh operation, such as a cell array, a row circuit for activating/deactivating rows of the cell array, a column circuit for inputting/outputting data to/from the cell array.

Figure 3:
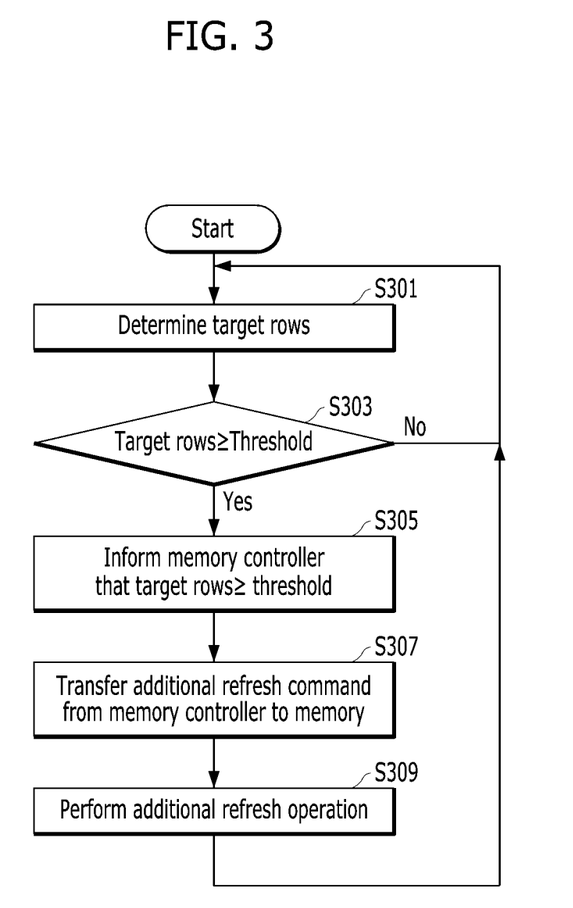
FIG. 3 is a flowchart describing a method for operating the memory system 200 shown in FIG. 2 in accordance with an embodiment of the present invention.

FIG. 3 is a flowchart describing a method for operating the memory system 200 shown in FIG. 2 in accordance with an embodiment of the present invention.

Referring to FIG. 3, in step S301, the target row determining circuit 225 of the memory 220 may determine a row that is likely to lose data as a target row. For example, the target row determining circuit 225 may determine the rows disposed adjacent to an excessively accessed row as target rows.

When the number of the target rows is equal to or greater than a threshold value ('Yes' in step S303), information ADD_REF_REQ representing the number of the target rows that are equal to or greater than the threshold value is activated, and this information ADD_REF_REQ may be transferred to the memory controller 210 through the data transferring/receiving circuit 223 in step S305. Here, although the information ADD_REF_REQ is illustrated to be transferred to the memory controller 210 through the data transferring/receiving circuit 223 in FIG. 2, those skilled in the art will recognize that the information ADD_REF_REQ may be transferred to the memory controller 210 through another route, for example, the information ADD_REF_REQ may be transferred to the memory controller 210 through another type of a pad. For reference, when the number of the target rows is less than a threshold value ('No' in step S303), the process proceeds back to the step S301.

When the information ADD_REF_REQ is transferred to the memory controller 210 through the data transferring/receiving circuit 223, the information ADD_REF_REQ may be transferred in a period in which data DATA are not transferred between the memory controller 210 and the memory 220. For example, since data DATA are not transferred between the memory controller 210 and the memory 220 during an active operation, the memory 220 may transfer the information ADD_REF_REQ to the memory controller 210 in a predetermined period after the active command is applied to the memory 220.

The memory controller 210 may transfer an additional refresh command to the memory 220 in response to the information ADD_REF_REQ in step S307. The additional refresh command may be transferred to the memory 220 through a command CMD.

The command decoder 224 of the memory 210 may decode the command CMD to activate an additional refresh signal ADD_REF, and in response to the activated additional refresh signal ADD_REF, a target row designated by the target address ADD_REF_ADD may be refreshed in step S309. Herein, one or more target rows may be refreshed, and the refreshed target rows may no longer be target rows.

Subsequently, the process proceeds back to the step S301.

According to the operation method of FIG. 3, when the number of target rows requiring an additional refresh operation in the memory 220 is equal to or greater than the threshold value, the memory 220 may transfer the information ADD_REF_REQ representing the number of target rows requiring an additional refresh operation in the memory 220 that are equal to or greater than the threshold value to the memory controller 210. The memory controller 210 may then apply an additional refresh command to the memory 220 in response to the information ADD_REF_REQ, and the target rows in the memory 210 may be refreshed. Accordingly, even in a memory system in which a refresh operation is rarely performed, such as a cryogenic memory system, target rows required to be refreshed due to a row hammering phenomenon may be refreshed instantly.

Figure 4:
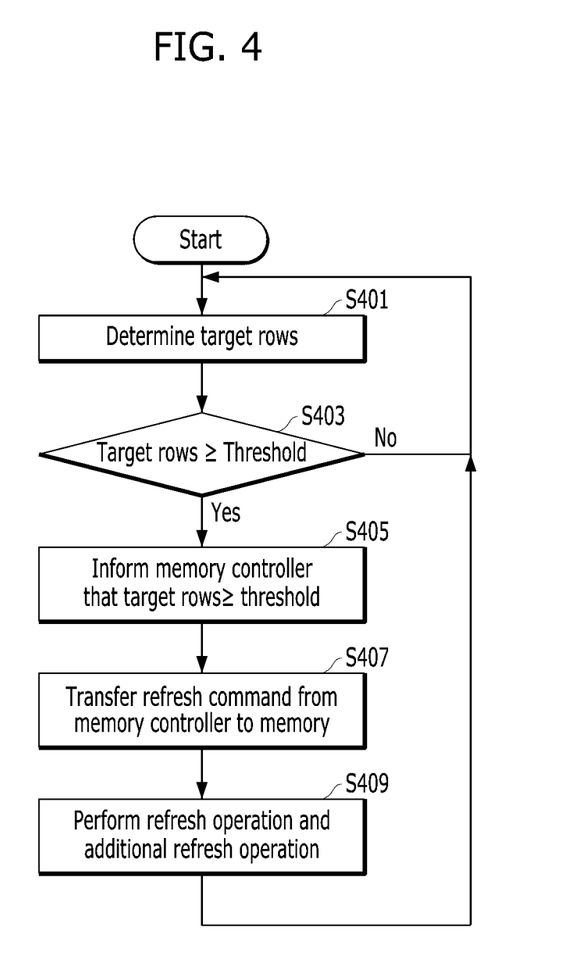
FIG. 4 is a flowchart describing a method for operating the memory system 200 shown in FIG. 2 in accordance with another embodiment of the present invention.

FIG. 4 is a flowchart describing a method for operating the memory system 200 shown in FIG. 2 in accordance with another embodiment of the present invention.

Referring to FIG. 4, the operations of the steps S301, S303, and S305 illustrated in FIG. 3 may be performed in the same manner in FIG. 4 (refer to S401, S403, and S405).

The memory controller 210 may transfer a refresh command to the memory 220 in response to the information ADD_REF_REQ in step S407. The refresh command may be transferred to the memory 220 through the command CMD.

The command decoder 224 of the memory 220 may decode the command CMD to activate a refresh signal REF, and in response to the activated refresh signal REF, a row designated by the refresh address REF_ADD may be refreshed. Also, a target row designated by a target address ADD_REF_ADD may be additionally refreshed in a refresh operation period in step S409. That is, the memory controller 210 may apply a refresh command to the memory 220 in response to the information ADD_REF_REQ, and the memory 220 may perform a general refresh operation and an additional refresh operation in a refresh operation period. When a refresh command is applied to the memory 220, an additional refresh operation may be performed after the refresh operation is performed as the command decoder 224 activates the refresh signal REF and then activates the additional refresh signal ADD_REF.

Subsequently, the process proceeds back to the step S401.

According to the operation method of FIG. 4, when the number of target rows requiring an additional refresh operation in the memory 220 is equal to or greater than the threshold value, the memory 220 may transfer the information ADD_REF_REQ representing the number of target rows requiring an additional refresh operation in the memory 220 that are equal to or greater than the threshold value to the memory controller 210. Also, the memory controller 210 may apply a refresh command to the memory 220 in response to the information ADD_REF_REQ, and a refresh operation and an additional refresh operation may be performed in the memory 220. Accordingly, even in a memory system in which a refresh operation is rarely performed, such as a cryogenic memory system, target rows required to be refreshed due to the row hammering phenomenon may be refreshed instantly.

Figure 5:
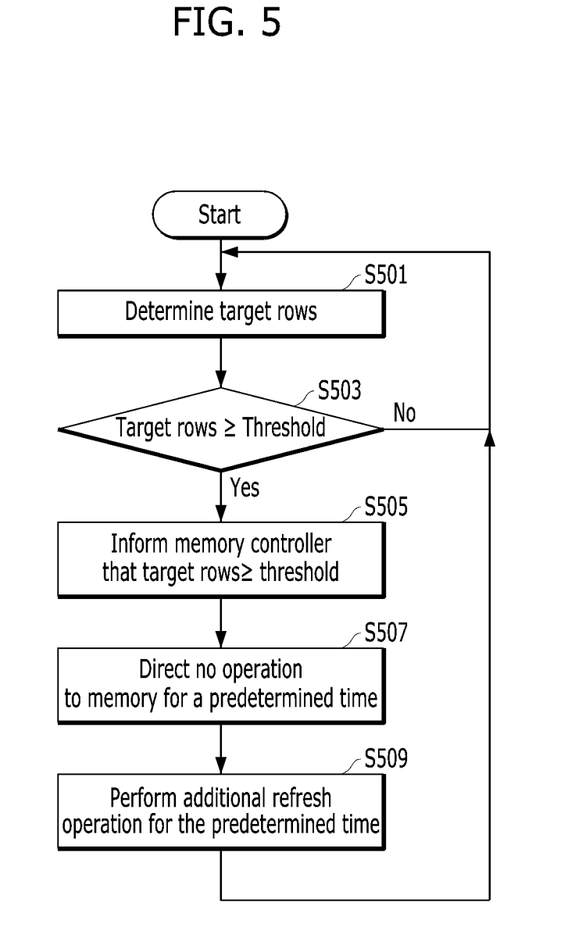
FIG. 5 is a flowchart describing a method for operating the memory system 200 shown in FIG. 2 in accordance with yet another embodiment of the present invention.

FIG. 5 is a flowchart describing a method for operating the memory system 200 shown in FIG. 2 in accordance with yet another embodiment of the present invention.

Referring to FIG. 5, the operations of the steps S301, S303, and S305 illustrated in FIG. 3 may be performed in the same manner in FIG. 5 (refer to S501, S503, and S505).

When the memory controller 210 receives the information ADD_REF_REQ, in step S507, the memory controller 210 may not apply any command to the memory 220 in a predetermined period after the information ADD_REF_REQ is received. That is, when the information ADD_REF_REQ is received, the memory controller 210 may not direct any operation to the memory 220 during the predetermined period.

The memory 220 may perform an additional refresh operation in a predetermined period after transferring the information ADD_REF_REQ to the memory controller 210 in step S509. Since no operation is to be directed to the memory 220 during the predetermined period, the memory 220 may be able to perform an additional refresh operation in the predetermined period. The target row determining circuit 225 may be able to transfer the activated information ADD_REF_REQ to the memory controller 210 through the data transferring/receiving circuit 223 and at the same time transfer the information ADD_REF_REQ to the command decoder 224. The command decoder 224 may activate the additional refresh signal ADD_REF in response to the reception of the activated information ADD_REF_REQ and as a result, an additional refresh operation may be performed. When the additional refresh operation is performed, the refreshed target row may no longer be a target row.

Subsequently, the process proceeds back to the step S401.

According to the operation method of FIG. 5, when the number of target rows requiring an additional refresh operation in the memory 220 is equal to or greater than a threshold value, the memory 220 may transfer information ADD_REF_REQ representing the number of target rows requiring an additional refresh operation in the memory 220 that are equal to or greater than the threshold value to the memory controller 210. Then, the memory controller 210 may not apply any command to the memory 220 during a predetermined time in response to the information ADD_REF_REQ, and the memory 220 may perform an additional refresh operation during the predetermined time. Therefore, even in a memory system in which a refresh operation is rarely performed, such as a cryogenic memory system, target rows required to be refreshed due to the row hammering phenomenon may be refreshed instantly.

According to the embodiments of the present invention, rows that need to be refreshed due to the row hammering phenomenon may be refreshed.

While the present invention has been described with respect to the specific embodiments, it will be apparent to those skilled in the art that various changes and modifications may be made without departing from the spirit and scope of the invention as defined in the following claims.

What is claimed is:

1. A memory comprising:
   a plurality of rows, each of which is coupled to a plurality of memory cells;
   a target row determining circuit configured to determine a row disposed adjacent to a row that is activated excessive times as a target row; and
   a transfer circuit configured to transfer information representing that a number of target rows reaches a threshold value to a memory controller, when the number of target rows determined by the target row determining circuit is equal to or greater than the threshold value.

2. The memory of claim 1, wherein when the memory controller applies a refresh command to the memory in response to the information, the target rows are refreshed.

3. The memory of claim 1, wherein the target rows are refreshed in a predetermined period after the information is transferred without receiving a command from the memory controller.

4. The memory of claim 1, wherein the transfer circuit transfers the information to the memory controller through a data pad.

5. The memory of claim 4, wherein the transfer circuit transfers the information to the memory controller in a predetermined period after an active command is applied from the memory controller.

6. A memory system comprising:
a memory controller; and
a memory,
wherein the memory includes:
a plurality of rows, each of which is coupled to a plurality of memory cells;
a target row determining circuit configured to determine a row disposed adjacent to a row that is activated excessive times as a target row; and
a transfer circuit configured to transfer information representing that a number of target rows reaches a threshold value to the memory controller, when the number of target rows determined by the target row determining circuit is equal to or greater than the threshold value,
wherein the memory controller is configured to transfer a command for refreshing the target rows to the memory when the information is received from the memory.

7. The memory system of claim 6, wherein the command is a refresh command, and
the memory refreshes the target rows in response to the refresh command.

8. The memory system of claim 6, wherein the transfer circuit transfers the information to the memory controller through a data pad.

9. The memory system of claim 8, wherein the transfer circuit transfers the information to the memory controller in a predetermined period after an active command is applied from the memory controller to the memory.

10. A memory system comprising:
a memory controller; and
a memory,
wherein the memory includes:
a plurality of rows, each of which is coupled to a plurality of memory cells;
a target row determining circuit configured to determine a row adjacent to a row that is activated excessive times as a target row; and
a transfer circuit configured to transfer information representing that a number of target rows reaches a threshold value to the memory controller, when the number of target rows determined by the target row determining circuit is equal to or greater than the threshold value,
wherein the memory controller is configured to apply no command to the memory in a predetermined period after the information is received from the memory.

11. The memory system of claim 10, wherein the memory refreshes the target row in the predetermined period.

12. The memory system of claim 10, wherein the transfer circuit transfers the information to the memory controller through a data pad in a predetermined period after an active command is applied from the memory controller to the memory.

13. A method for operating a memory system including a memory controller and a memory, the method comprising:
determining, by the memory, a row disposed adjacent to a row that is activated excessive times as a target row;
determining, by the memory, whether a number of target rows reaches a threshold value or not; and
transferring, by the memory, information representing that the number of the target rows reaches the threshold value to the memory controller.

14. The method of claim 13, further comprising:
transferring, by the memory controller, a refresh command to the memory in response to the information; and
refreshing, by the memory, the target rows in response to the refresh command.

15. The method of claim 14, further comprising:
refreshing, by the memory, the target rows in a predetermined period after the information is transferred without receiving a command from the memory controller in the predetermined period.

16. A method for operating a memory, the method comprising:
determining, as a target row, a neighboring row disposed adjacent to a row with excessive activation times;
checking whether a number of target rows reaches a threshold value or not;
informing a memory controller when the number of the target rows reaches the threshold value; and
performing a refresh operation on the target rows.

17. The method of claim 16, wherein the refresh operation is performed on the target rows in a predetermined period after the informing the memory controller without receiving a command from the memory controller in the predetermined period.

* * * * *